United States Patent [19]
Yen et al.

[11] Patent Number: 6,028,349
[45] Date of Patent: Feb. 22, 2000

[54] RE-ROUTING LEAD FRAME PACKAGE AND SEMICONDUCTOR MEMORY PACKAGE USING THE SAME

[75] Inventors: Dah-Sheng Yen; Chang-Min Chou, both of Hsinchu, Taiwan

[73] Assignee: PTI Powertest Technology, Inc., Hsinchu, Taiwan

[21] Appl. No.: 09/346,911

[22] Filed: Jul. 2, 1999

[51] Int. Cl.[7] .................................................. H01L 23/495
[52] U.S. Cl. ............................................ 257/666; 257/676
[58] Field of Search .................................... 257/666, 672, 257/673, 676

[56] References Cited

U.S. PATENT DOCUMENTS

| | | |
|---|---|---|
| 5,229,639 | 7/1993 | Hansen et al. . |
| 5,331,201 | 7/1994 | Nishino . |
| 5,886,396 | 3/1999 | Caeney et al. . |
| 5,903,050 | 5/1999 | Thuairajaratnam et al. . |
| 5,907,184 | 5/1999 | Corisis et al. . |
| 5,914,529 | 6/1999 | King et al. . |

*Primary Examiner*—Sheila V. Clark
*Attorney, Agent, or Firm*—Rosenberg, Klein & Lee

[57] ABSTRACT

The present invention discloses a semiconductor memory stack including two semiconductor memory packages stacked together. The semiconductor memory packages are electrically connected by pins. At least one of the semiconductor memory packages has a lead frame provided with a re-routing pin connected to a laterally extended conductive layer. According to the present invention, a memory device with a larger capacity can be obtained by stacking two semiconductor memory packages with a smaller capacity, thereby reducing the cost and simplifying the manufacturing process.

5 Claims, 7 Drawing Sheets

```
VDD  — 1      54 — VSS
NC   — 2      53 — NC
VDDQ — 3      52 — VSSQ
NC   — 4      51 — NC
DQ0  — 5      50 — DQ3
VSSQ — 6      49 — VDDQ
NC   — 7      48 — NC
NC   — 8      47 — NC
VDDQ — 9      46 — VSSQ
NC   — 10     45 — NC
DQ1  — 11     44 — DQ2
VSSQ — 12     43 — VDDQ
NC   — 13     42 — NC
VDD  — 14     41 — VSS
/CS  — 15     40 — NC
/WE  — 16     39 — DQM
/CAS — 17     38 — CLK
/RAS — 18     37 — CKE
NC   — 19     36 — NC
BA0  — 20     35 — A11
BA1  — 21     34 — A9
A10  — 22     33 — A8
A0   — 23     32 — A7
A1   — 24     31 — A6
A2   — 25     30 — A5
A3   — 26     29 — A4
VDD  — 27     28 — VSS
```

Fig. 3A

| | | | |
|---|---|---|---|
| VDD | 1 | 54 | VSS |
| NC | 2 | 53 | NC |
| VDDQ | 3 | 52 | VSSQ |
| NC | 4 | 51 | NC |
| DQ0 | 5 | 50 | DQ3 |
| VSSQ | 6 | 49 | VDDQ |
| NC | 7 | 48 | NC |
| NC | 8 | 47 | NC |
| VDDQ | 9 | 46 | VSSQ |
| NC | 10 | 45 | NC |
| DQ1 | 11 | 44 | DQ2 |
| VSSQ | 12 | 43 | VDDQ |
| NC | 13 | 42 | NC |
| VDD | 14 | 41 | VSS |
| /CS1 | 15 | 40 | NC |
| /WE | 16 | 39 | DQM |
| /CAS | 17 | 38 | CLK |
| /RAS | 18 | 37 | CKE |
| /CS0 | 19 | 36 | NC |
| BA0 | 20 | 35 | A11 |
| BA1 | 21 | 34 | A9 |
| A10 | 22 | 33 | A8 |
| A0 | 23 | 32 | A7 |
| A1 | 24 | 31 | A6 |
| A2 | 25 | 30 | A5 |
| A3 | 26 | 29 | A4 |
| VDD | 27 | 28 | VSS |

Fig. 4

RE-ROUTING LEAD FRAME PACKAGE AND SEMICONDUCTOR MEMORY PACKAGE USING THE SAME

FIELD OF THE INVENTION

The present invention relates to a semiconductor memory stack, and more particularly, to a semiconductor memory having a re-routing lead frame package.

BACKGROUND OF THE INVENTION

Semiconductor memories have been widely used in various electronic apparatuses such as personal computer, display card and printer. Due to enhanced performances of electronic apparatuses and decreased dimensions thereof, capacity of a semiconductor memory has to be expanded accordingly. An approach is to use a plurality of semiconductor memories at the same time, but it occupies a large space, so that area of a circuit board can not be optimally used. Another semiconductor memory capacity expansion approach is to develop semiconductor memories of high capacities. However, consideration development cost and manufacturing cost are needed for the semiconductor memories of high capacities.

To stack two or more semiconductor memory packages to form a memory device having a high capacity can solve the above problem. However, wiring in each chip of a conventional semiconductor memory stack varies, and thus different specification requirements for respective packages are disadvantageous to manufacture management.

Therefore, it is necessary to propose an approach to overcome the prior art disadvantages.

SUMMARY OF THE INVENTION

An object of the present invention is to set forth a semiconductor memory stack for obtaining a higher capacity with a simpler manufacturing process and a lower cost, which is achieved by stacking two semiconductor memory packages of lower capacities by adjusting route of a lead frame.

Another object of the present invention is provide a semiconductor memory stack having an expanded capacity without increasing the area of a circuit board occupied by the memory.

According to the present invention, a semiconductor memory stack comprises two semiconductor memory packages. The two semiconductor memory packages are stacked together and electrically connected by pins. A lead frame of at least one of the semiconductor memory packages comprises a re-routing pin connected to a laterally extended conductive layer.

These and other objects, features and advantages of the present invention will become apparent to those skilled in the art upon consideration of the following description of the preferred embodiment of the present invention taken in conjunction with the accompanying drawings

BRIEF DESCRIPTION OF THE DRAWINGS

FIGS. 3A and 3B show pins and a lead frame of a semiconductor memory package according to the present invention, respectively.

FIG. 4 shows pins of a semiconductor memory device obtained by combining FIGS. 2A and 3A.

DETAILED DESCRIPTION

Figure 1:
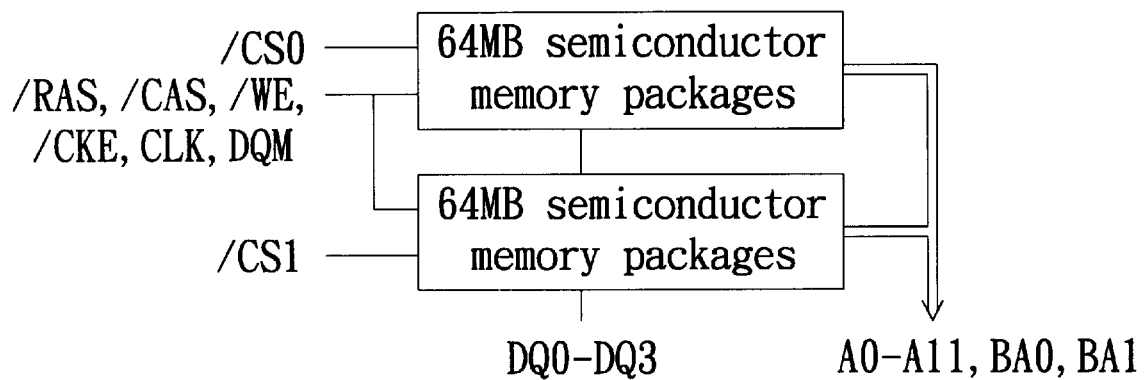
FIG. 1 is a circuit block diagram of a semiconductor memory stack.

FIG. 1 is a circuit block diagram of a semiconductor memory stack in which two semiconductor memory packages each having 64 MB capacity are connected to each other. The two memories are selected by signal/CS0 and signal/CS1, respectively, so that a memory of 128 MB in total is obtained.

Figure 2A:
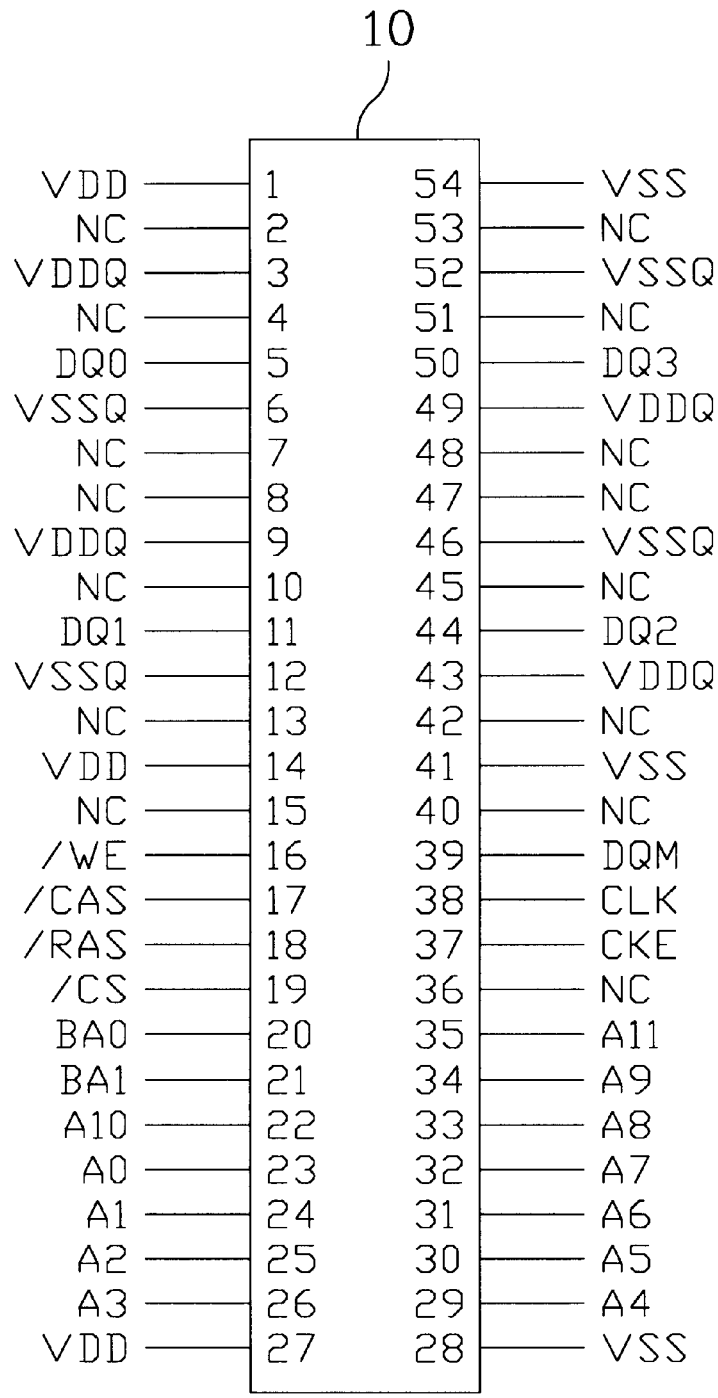
FIGS. 2A and 2B show pins and a lead frame of a prior art semiconductor memory package, respectively.
Figure 2B:
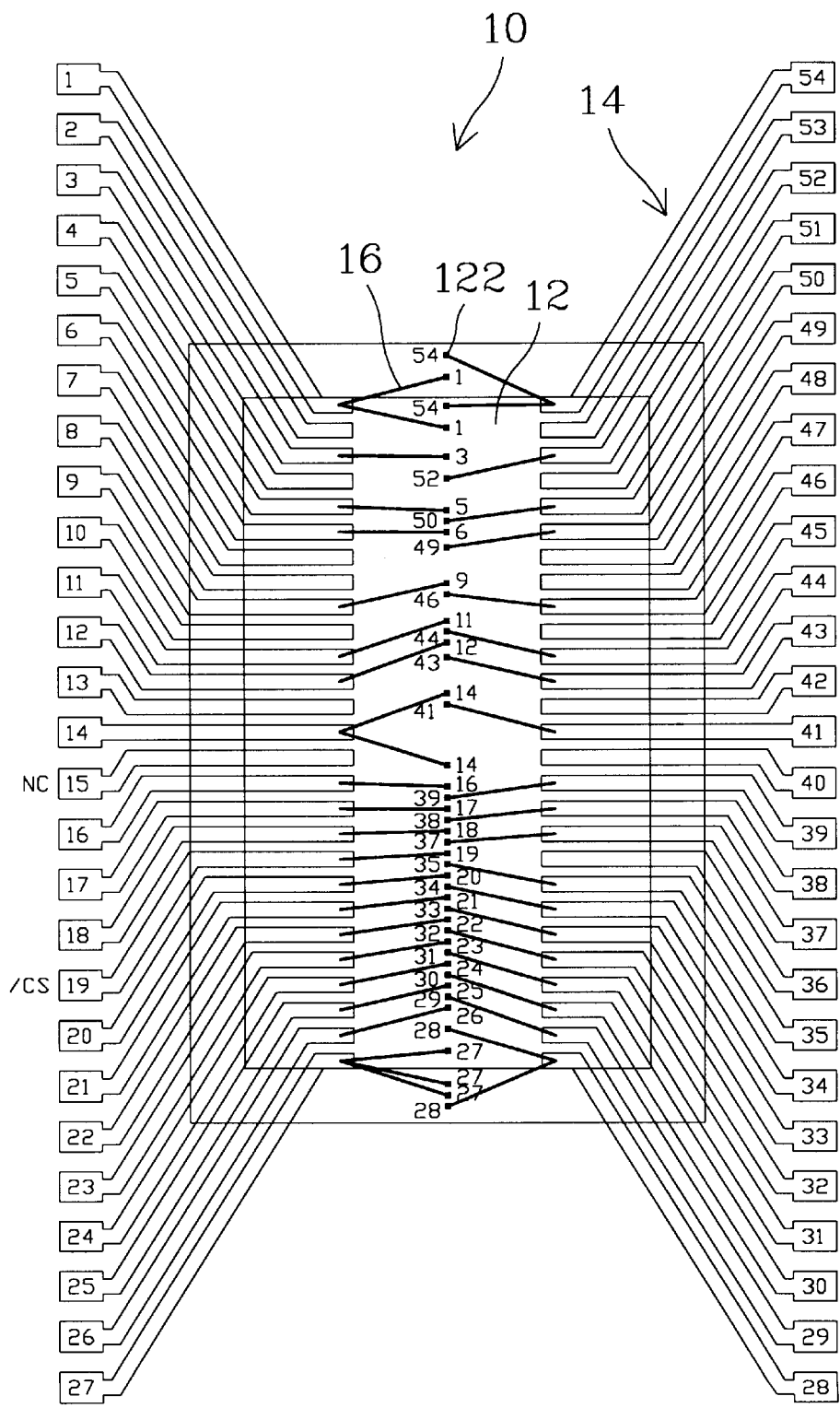

FIGS. 2A and 2B show pins and a lead frame of a prior art semiconductor memory package, respectively. A first semiconductor memory package 10 comprises a semiconductor chip 12 on which a plurality of contacts 122 are provided. A lead frame 14 is attached to the chip 12 and has a plurality of pins. The contacts 122 and the pins are electrically connected by leads 16. A package layer made of a molding compound, such as epoxy resin, for mechanically protecting the chip 12, lead frame 14 and leads 16 is coated. Pin 15 of the lead frame 14 is not connected, and pin 19 provides an external signal /CS to determine on/off state of the package 10.

Figure 3B:
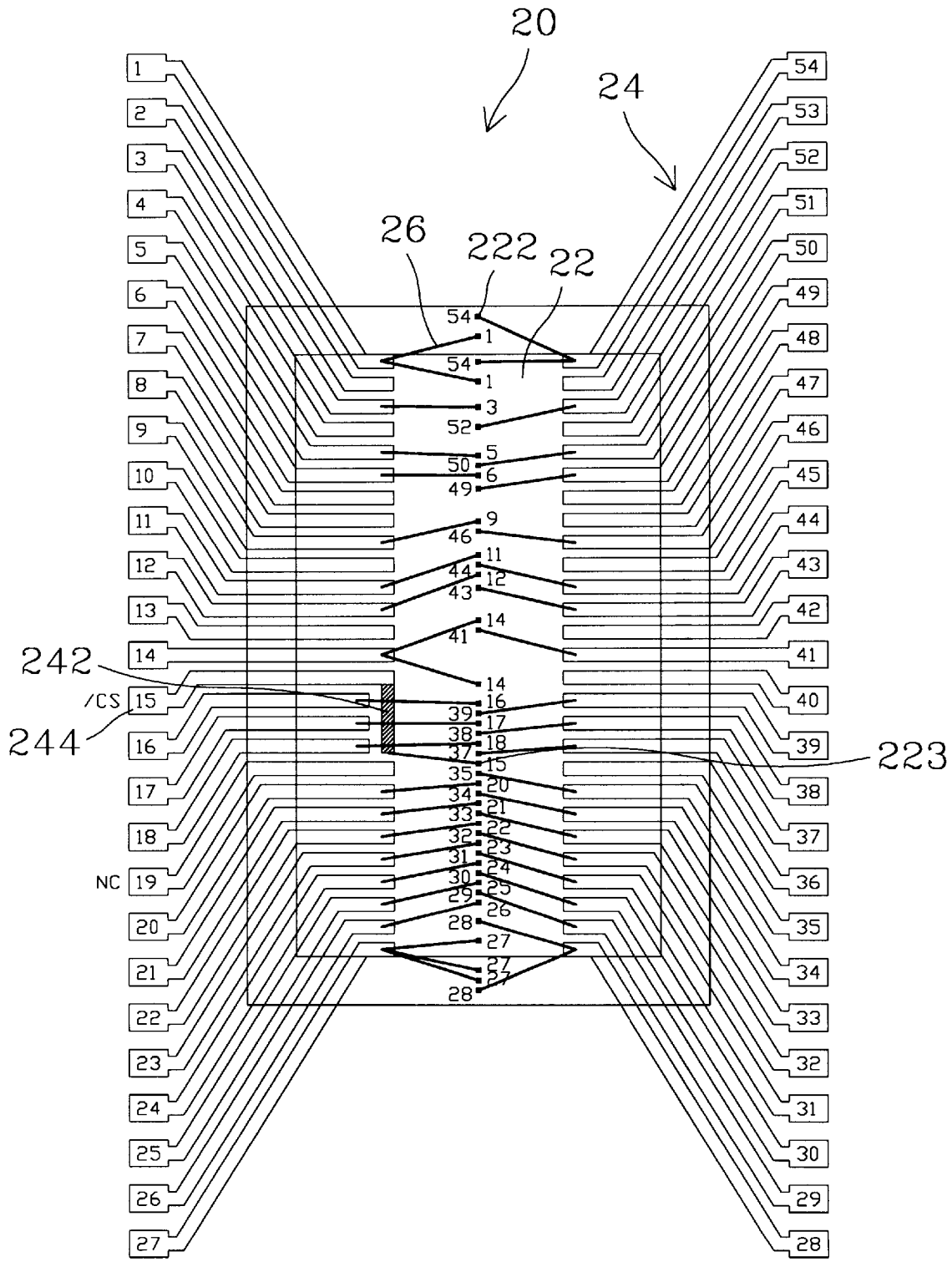
Figure 3C:
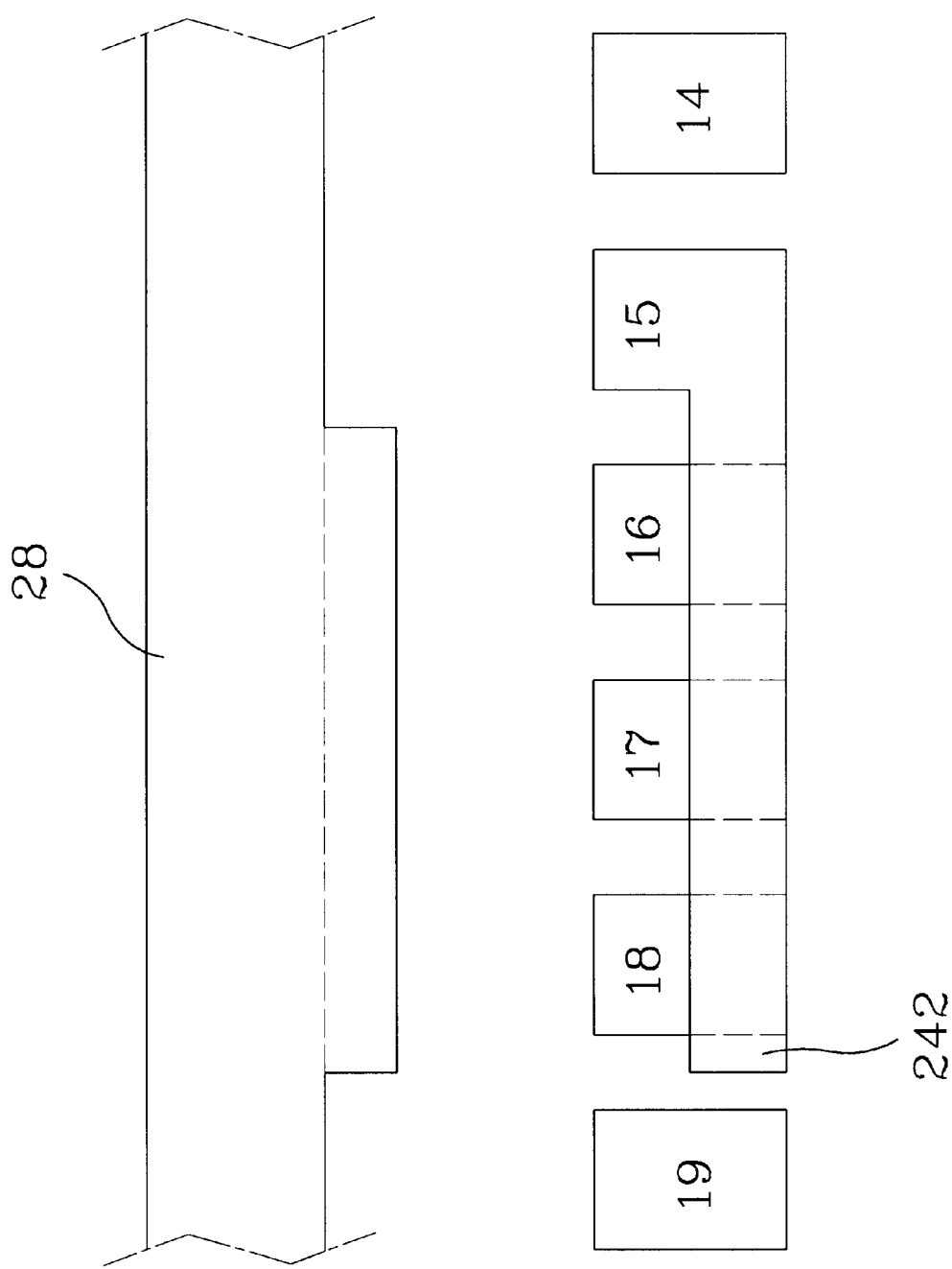
FIG. 3C is a partial side view taken from FIG. 3B.

FIGS. 3A and 3B show pins and a lead frame of a semiconductor memory package, respectively. A semiconductor chip 22 of a second memory 20 has the same memory circuits as those of the semiconductor chip 12 of the first memory 10, and a plurality of contacts 222 are provided thereon. A lead frame 24 comprises a plurality of pins among which pin No. 15 is a re-routing pin 244 having a front end connected to a conductive layer 242 laterally extended along a route. The pins adjacent to the route have a length smaller than length of the re-routing pin 244. FIG. 3C is a partial side view taken from FIG. 3B. Height of the conductive layer 242 is about one half thickness of the pin. Preferably, the conductive layer 242 is made of iron-nickel alloy. A lead clip is provided on the conductive layer 242 and the pins. The conductive layer 242 is electrically connected to one of the contacts 222 (i.e., contact 223) by a lead 26 such that pin No. 15 provides an external signal /CS to determine on/off state of the semiconductor chip 22.

In comparison with the first semiconductor memory package 10, the second semiconductor memory package 20 utilizes the lead frame have the pin connected to the laterally extended conductive layer 242.

A semiconductor memory device shown in FIG. 4 can be obtained by stacking the devices shown in FIGS. 2A and 3A and connecting corresponding pins. In FIG. 4, pin No. 15 of a semiconductor memory stack 30 receives an input signal /CS1 for determining on/off state of the second semiconductor memory package 20, and pin No. 19 receives another input signal /CS0 for determining on/off state of the first semiconductor memory package 10. Therefore, the semiconductor memory stack 30 has a capacity which is the sum of the capacity of the first semiconductor memory package 10 and that of the second semiconductor memory package 20.

In other words, the present invention utilizes a simple semiconductor memory stack instead of a complicated semiconductor memory device. For example, in FIG. 1, two DRAMs each having 64 MB are stacked to obtain a DRAM of 128 MB. Manufacturing DRAMs of 128 MB is far more complicated and difficult than manufacturing DRAMs of 64 MB. Further, two DRAMs of 64 MB stacked together occupy less space on a circuit board than a DRAM of 128 MB. In addition, if one of them fails, it can be replaced easily. On the other hand, the semiconductor memory package stack can improves utilization efficiency of a circuit board since it occupies a smaller space.

While the present invention has been described in conjunction with preferred embodiments thereof, it is evident that many alternatives, modifications and variations will be apparent to those skilled in the art. For example, more than 2 semiconductor memory packages can be stacked to obtain a memory device of a higher capacity. Accordingly, it is intended to embrace all such alternatives, modifications and variations that fall within the spirit and scope thereof as set forth in the appended claims.

What is claimed is:

1. A re-routing semiconductor memory package, comprising:
   a semiconductor chip including a memory circuit and provided with a plurality of contacts thereon;
   a lead frame provided with a plurality of pins wherein at least one of said plurality of pins is a re-routing pin connected to a conductive layer laterally extended along a route;
   a lead for connecting said conductive layer with one of said plurality of contacts;
   a lead clip for covering said lead frame; and
   a package layer for covering said semiconductor chip, said lead frame, said lead and said lead clip.

2. The semiconductor memory package according to claim 1, wherein said conductive layer has a height equal to half thickness of said lead.

3. The semiconductor memory package according to claim 1, wherein said conductive layer comprises Fe—Ni alloy.

4. The semiconductor memory package according to claim 1, wherein the pins adjacent to said route have a length smaller than length of said re-routing pin.

5. A semiconductor memory stack comprising two semiconductor memory packages which have the same memory circuit and are stacked together and electrically connected by pins, each of said semiconductor memory packages comprising:
   a semiconductor chip including a memory circuit and provided with a plurality of contacts thereon;
   a lead frame provided with a plurality of pins;
   a plurality of leads for connecting said conductive layer with said plurality of contacts;
   a lead clip for covering said lead frame; and
   a package layer for covering said semiconductor chip, said lead frame, said lead and said lead clip;
   wherein said lead frame of at least one of said semiconductor memory packages comprises at least a re-routing pin connected to a laterally extended conductive layer, and the conductive layer is connected to one of said plurality of contacts by one of said plurality of leads.

* * * * *